(12) United States Patent
Jin et al.

(10) Patent No.: US 10,249,846 B2
(45) Date of Patent: Apr. 2, 2019

(54) OLED PACKAGING METHOD AND OLED PACKAGE STRUCTURE

(71) Applicant: Wuhan China Star Optoelectronics Technology Co., Ltd., Wuhan (CN)

(72) Inventors: Jiangjiang Jin, Wuhan (CN); Hsianglun Hsu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 64 days.

(21) Appl. No.: 15/505,119

(22) PCT Filed: Dec. 28, 2016

(86) PCT No.: PCT/CN2016/112531
§ 371 (c)(1),
(2) Date: Feb. 20, 2017

(87) PCT Pub. No.: WO2018/113005
PCT Pub. Date: Jun. 28, 2018

(65) Prior Publication Data
US 2018/0226614 A1    Aug. 9, 2018

(30) Foreign Application Priority Data

Dec. 19, 2016   (CN) .......................... 2016 1 1180720

(51) Int. Cl.
*H01L 51/52* (2006.01)
*H01L 51/56* (2006.01)

(52) U.S. Cl.
CPC ...... *H01L 51/5268* (2013.01); *H01L 51/5237* (2013.01); *H01L 51/5253* (2013.01);
(Continued)

(58) Field of Classification Search
CPC . H01L 51/52; H01L 51/5268; H01L 51/5253; H01L 51/56; H01L 51/5284
See application file for complete search history.

(56) References Cited

U.S. PATENT DOCUMENTS

2012/0276666 A1* 11/2012 Wei ................... H01L 21/02521
438/22
2016/0154178 A1* 6/2016 Jaeger ................. H01L 51/5275
385/14
(Continued)

FOREIGN PATENT DOCUMENTS

CN         1563243 A    1/2005
CN       105977394 A    9/2016

*Primary Examiner* — Phuc T Dang
(74) *Attorney, Agent, or Firm* — Leong C. Lei (57) ABSTRACT

The present invention provides an OLED packaging method and an OLED package structure. The OLED packaging method of the present invention is such that a silicon-doped diamond-like carbon layer and a diamond-like carbon scattering layer are both provided in an OLED package structure so that the silicon-doped diamond-like carbon layer may provide an effect of blocking external moisture and oxygen and the diamond-like carbon scattering layer is used to provide an effect of increasing light transmission rate, whereby it is possible to greatly extend the service life of the OLED device and also to ensure a relatively high light output efficiency of the OLED device. The OLED package structure of the present invention is such that a silicon-doped diamond-like carbon layer and a diamond-like carbon scattering layer are both provided, so that the silicon-doped diamond-like carbon layer may provide an effect of blocking external moisture and oxygen and the diamond-like carbon scattering layer is used to provide an effect of increasing light transmission rate, whereby it is possible to greatly (Continued)

extend the service life of the OLED device and also to ensure a relatively high light output efficiency of the OLED device.

13 Claims, 5 Drawing Sheets

(52) U.S. Cl.
CPC .......... *H01L 51/56* (2013.01); *H01L 2251/10* (2013.01); *H01L 2251/53* (2013.01)

(56) References Cited

U.S. PATENT DOCUMENTS

2017/0003808 A1*  1/2017  Kim ..................... G06F 3/044
2017/0062764 A1*  3/2017  Liu ..................... H01L 51/5268

* cited by examiner

OLED PACKAGING METHOD AND OLED PACKAGE STRUCTURE

BACKGROUND OF THE INVENTION

1. Field of the Invention

The present invention relates to the field of display technology, and more particular to an OLED packaging method and an OLED package structure.

2. The Related Arts

Organic light-emitting display (OLED) possesses various advantages, such as being self-luminous, low drive voltage, high luminous efficiency, short response time, high clarity and contrast, almost 180° view angle, wide range of operation temperature, and easy realization of flexible displaying and large-area full-color displaying, and is considered the most promising display device in the industry.

Based on the way of driving, OLEDs can be classified in two categories, passive matrix OLED (PMOLED) and active matrix OLED (AMOLED), namely two categories of direct addressing and TFT array addressing, among which the AMOLED comprises pixels that are arranged in an array and belongs to an active display type, having high light emission performance and being commonly used in high definition large-sized display devices.

An OLED device is generally made up of a substrate, an anode arranged on the substrate, a hole injection layer arranged on and anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of the OLED device is that when a semiconductor material and an organic light emission material are driven by an electric field, carrier currents are injected and re-combine to cause emission of light. Specifically, the OLED device often uses an indium tin oxide (ITO) electrode and a metal electrode to respectively serve as anode and cathode of the device and electrons and holes, when driven by a predetermined electrical voltage, are respectively injected into the electron transport layer and the hole transport layer from the cathode and the anode such that the electrons and the holes respectively migrate through the electron transport layer and the hole transport layer to get into the emissive layer and meet in the emissive layer to form excitons to excite light emissive molecules to emit light, the later undergoing radiation relaxation to give off visible light.

The OLED device is very sensitive to moisture and once exposed in moisture, the cathode might get oxidized and the organic layers (the hole injection layer, the hot transport layer, the emissive layer, the electron transport layer, and the electron injection layer) may be degraded so as to reduce the brightness and service life of the OLED device. Thus, a packaging material of an OLED device must exhibit powerful capabilities of resisting external moisture and oxygen in order to improve the brightness and service life of the OLED device.

Diamond-like carbon (DLC) is a material that possesses relatively good characteristics of blocking moisture and oxygen and has prosperous future of application in the field of OLED packaging. As early as the year 2005, Abbas has reported, in an article published in *Thin Solid Films* 482 (2005) 201-206, systematic researches in respect of water vapor transmission rate (WVTR), refractive index, and light transmission rate of diamond-like carbon and the results of the researches reveal the water vapor transmission rate of the diamond-like carbon is reduced with an increase of the thickness thereof, and when the thickness of the diamond-like carbon reaches around 70 nm, the water vapor transmission rate no longer shows significant reduction. On the other hand, introduction of a minor amount of element silicon (Si) in the diamond-like carbon may increase the capability of blocking moisture and oxygen, but reduces the density, transmission rate, and refractive index. Thus, effectively dissolving confliction between the capability of the diamond-like carbon for blocking external moisture and oxygen and the density, transmission rate, and refractive index thereof is directly linked to actual applications of diamond-like carbon.

SUMMARY OF THE INVENTION

Objectives of the present invention are to provide an OLED packaging method, which greatly extends the service life of an OLED device and also ensures a relatively high light output efficiency of the OLED device.

Objectives of the present invention are also to provide an OLED package structure, which greatly extends the service life of an OLED device and also ensures a relatively high light output efficiency of the OLED device.

To achieve the above objectives, the present invention provides an OLED packaging method, which comprises the following steps:

Step 1: providing a OLED device and forming a first barrier layer on the OLED device such that the first barrier layer covers an entire surface of the OLED device;

Step 2: forming a first silicon-doped diamond-like carbon layer on the first barrier layer such that the first silicon-doped diamond-like carbon layer covers an entire surface of the first barrier layer;

Step 3: forming a diamond-like carbon scattering layer on the first silicon-doped diamond-like carbon layer;

Step 4: forming a first organic buffer layer on the first silicon-doped diamond-like carbon layer and the diamond-like carbon scattering layer such that the first organic buffer layer completely covers the first silicon-doped diamond-like carbon layer and the diamond-like carbon scattering layer; and Step 5: forming a second barrier layer on the first organic buffer layer, such that the second barrier layer covers an entire surface of the first organic buffer layer.

In Step 2, pulsed laser deposition, sputtering, or plasma enhanced chemical vapor deposition is applied to form the first silicon-doped diamond-like carbon layer; and the first silicon-doped diamond-like carbon layer is formed of a material comprising diamond-like carbon doped with element silicon, wherein a content amount of element silicon is less than 10 wt %; the first silicon-doped diamond-like carbon layer has a light transmission rate that is greater than or substantially equal to 95%; and the first silicon-doped diamond-like carbon layer has a thickness of 10 nm-100 nm.

In Step 3, pulsed laser deposition, sputtering, or plasma enhanced chemical vapor deposition is applied to form the diamond-like carbon scattering layer; and the diamond-like carbon scattering layer is formed of a material comprising non-doped diamond-like carbon; the diamond-like carbon scattering layer comprises a plurality of strip-like diamond-like carbon film layers spaced from each other or a plurality of circular diamond-like carbon film layers arranged in an array; and the diamond-like carbon scattering layer has a thickness of 10 nm-1 μm.

In Step 1, plasma enhanced chemical vapor deposition, atomic layer deposition, pulsed laser deposition, or sputtering is applied to form the first barrier layer;

the first barrier layer is formed of a material comprising one or multiple ones of zirconium aluminate, graphene, aluminum oxide, zirconium oxide, zinc peroxide, silicon nitride, silicon carbonitride, silicon oxide, and titanium dioxide; and the first barrier layer has a thickness of 0.5 μm-1 μm; and in Step 4, ink jet printing, plasma enhanced chemical vapor deposition, or slot coating is applied to form the first organic buffer layer; the first organic buffer layer is formed of a material comprising one or multiple ones of acrylic resin, compounds of polystyrenes, and compounds of polyesters; and the first organic buffer layer has a thickness of 1 μm-10 μm.

Optionally, the OLED packaging method according to the present invention further comprises Step 6: forming a second silicon-doped diamond-like carbon layer on the second barrier layer to cover an entire surface of the second barrier layer, forming a second organic buffer layer on the second silicon-doped diamond-like carbon layer to cover an entire surface of the second silicon-doped diamond-like carbon layer, and forming a third barrier layer on the second organic buffer layer to cover an entire surface of the second organic buffer layer.

The present invention also provides an OLED package structure, which comprises an OLED device, a first barrier layer arranged on the OLED device and covering an entire surface of the OLED device, a first silicon-doped diamond-like carbon layer arranged on the first barrier layer and covering an entire surface of the first barrier layer, a diamond-like carbon scattering layer arranged on the first silicon-doped diamond-like carbon layer, a first organic buffer layer arranged on the first silicon-doped diamond-like carbon layer and the diamond-like carbon scattering layer and completely covering the first silicon-doped diamond-like carbon layer and the diamond-like carbon scattering layer, and a second barrier layer arranged on the first organic buffer layer and covering an entire surface of the first organic buffer layer.

The first silicon-doped diamond-like carbon layer is formed of a material comprising diamond-like carbon doped with element silicon, wherein a content amount of element silicon is less than 10 wt %; the first silicon-doped diamond-like carbon layer has a light transmission rate that is greater than or substantially equal to 95%; and the first silicon-doped diamond-like carbon layer has a thickness of 10 nm-100 nm.

The diamond-like carbon scattering layer is formed of a material comprising non-doped diamond-like carbon; the diamond-like carbon scattering layer comprises a plurality of strip-like diamond-like carbon film layers spaced from each other or a plurality of circular diamond-like carbon film layers arranged in an array; and the diamond-like carbon scattering layer has a thickness of 10 nm-1 μm.

The first barrier layer is formed of a material comprising one or multiple ones of zirconium aluminate, graphene, aluminum oxide, zirconium oxide, zinc peroxide, silicon nitride, silicon carbonitride, silicon oxide, and titanium dioxide; and the first barrier layer has a thickness of 0.5 μm-1 μm; and the first organic buffer layer is formed of a material comprising one or multiple ones of acrylic resin, compounds of polystyrenes, and compounds of polyesters; and the first organic buffer layer has a thickness of 1 μm-10 μm.

Optionally, the OLED package structure according to the present invention further comprises: a second silicon-doped diamond-like carbon layer arranged on the second barrier layer and covering an entire surface of the second barrier layer, a second organic buffer layer arranged on the second silicon-doped diamond-like carbon layer and covering an entire surface of the second silicon-doped diamond-like carbon layer, and a third barrier layer arranged on the second organic buffer layer and covering an entire surface of the second organic buffer layer The present invention further provides an OLED package structure, which comprises an OLED device, a first barrier layer arranged on the OLED device and covering an entire surface of the OLED device, a first silicon-doped diamond-like carbon layer arranged on the first barrier layer and covering an entire surface of the first barrier layer, a diamond-like carbon scattering layer arranged on the first silicon-doped diamond-like carbon layer, a first organic buffer layer arranged on the first silicon-doped diamond-like carbon layer and the diamond-like carbon scattering layer and completely covering the first silicon-doped diamond-like carbon layer and the diamond-like carbon scattering layer, and a second barrier layer arranged on the first organic buffer layer and covering an entire surface of the first organic buffer layer;

wherein the first silicon-doped diamond-like carbon layer is formed of a material comprising diamond-like carbon doped with element silicon, wherein a content amount of element silicon is less than 10 wt %; the first silicon-doped diamond-like carbon layer has a light transmission rate that is greater than or substantially equal to 95%; and the first silicon-doped diamond-like carbon layer has a thickness of 10 nm-100 nm; and wherein the diamond-like carbon scattering layer is formed of a material comprising non-doped diamond-like carbon; the diamond-like carbon scattering layer comprises a plurality of strip-like diamond-like carbon film layers spaced from each other or a plurality of circular diamond-like carbon film layers arranged in an array; and the diamond-like carbon scattering layer has a thickness of 10 nm-1 μm.

The efficacy of the present invention is that the present invention provides an OLED packaging method and an OLED package structure. The OLED packaging method of the present invention is such that a silicon-doped diamond-like carbon layer and a diamond-like carbon scattering layer are both provided in an OLED package structure so that the silicon-doped diamond-like carbon layer may provide an effect of blocking external moisture and oxygen and the diamond-like carbon scattering layer is used to provide an effect of increasing light transmission rate, whereby it is possible to greatly extend the service life of the OLED device and also to ensure a relatively high light output efficiency of the OLED device. The OLED package structure of the present invention is such that a silicon-doped diamond-like carbon layer and a diamond-like carbon scattering layer are both provided, so that the silicon-doped diamond-like carbon layer may provide an effect of blocking external moisture and oxygen and the diamond-like carbon scattering layer is used to provide an effect of increasing light transmission rate, whereby it is possible to greatly extend the service life of the OLED device and also to ensure a relatively high light output efficiency of the OLED device.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
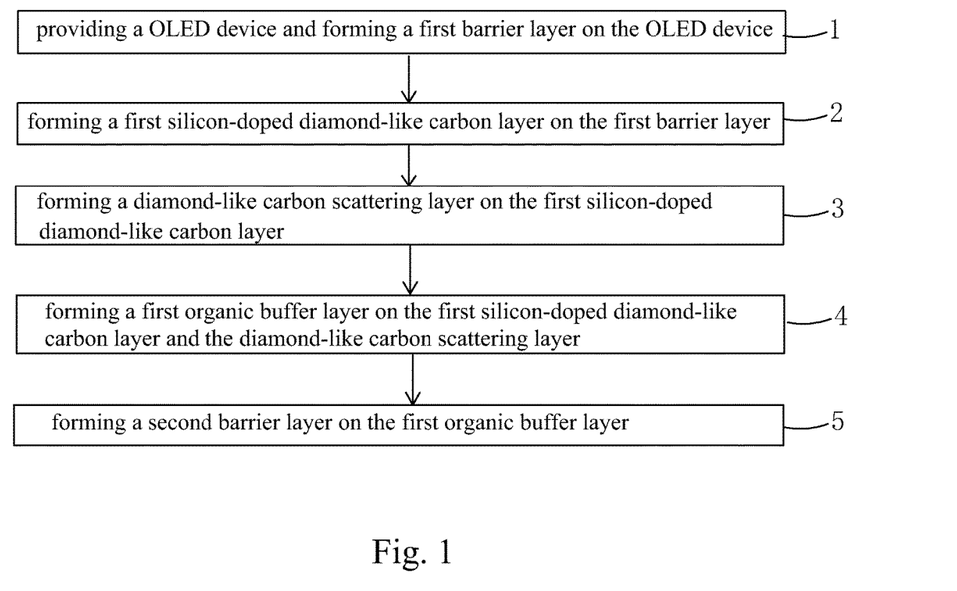
FIG. 1 is a flow chart illustrating an OLED packaging method according to the present invention.
Figure 2:
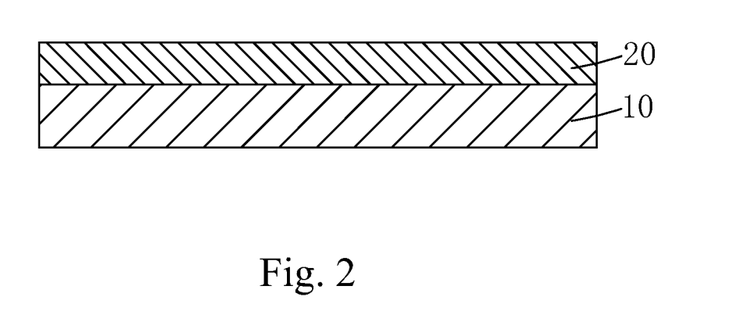
FIG. 2 is a schematic view illustrating Step 1 of the OLED packaging method according to the present invention.

Referring to FIG. 1, the present invention provides an OLED packaging method, which comprises the following steps:

Step 1: as shown in FIG. 2, providing an OLED device 10 and forming a first barrier layer 20 on the OLED device 10 such that the first barrier layer 20 covers an entire surface of the OLED device 10.

Specifically, in Step 1, plasma enhanced chemical vapor deposition (PECVD), atomic layer deposition (ALD), pulsed laser deposition (PLD), or sputtering is applied to form the first barrier layer 20.

Specifically, the first barrier layer 20 is formed of a material comprising one or multiple ones of zirconium aluminate ($ZrAl_xO_y$), graphene, aluminum oxide ($Al_2O_3$), zirconium oxide ($ZrO_2$), zinc peroxide ($ZnO_2$), silicon nitride ($SiN_x$), silicon carbonitride (SiCN), silicon oxide ($SiO_x$), and titanium dioxide ($TiO_2$).

Specifically, the first barrier layer 20 has a thickness of 0.5 μm-1 μm.

Specifically, the first barrier layer 20 provides a function of blocking moisture and oxygen from corroding the OLED device 10.

Figure 3:
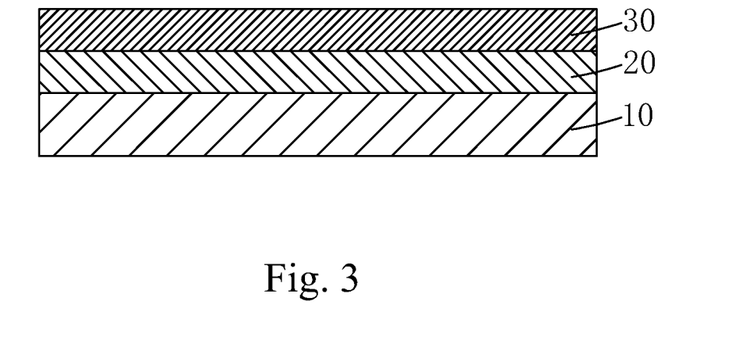
FIG. 3 is a schematic view illustrating Step 2 of the OLED packaging method according to the present invention.

Step 2: as shown in FIG. 3, forming a first silicon-doped diamond-like carbon (DLC) layer 30 on the first barrier layer 20 such that the first silicon-doped diamond-like carbon layer 30 covers an entire surface of the first barrier layer 20.

Specifically, in Step 2, pulsed laser deposition (PLD), sputtering, or plasma enhanced chemical vapor deposition (PECVD) is applied to form the first silicon-doped diamond-like carbon layer 30.

Specifically, the first silicon-doped diamond-like carbon layer 30 is formed of a material comprising diamond-like carbon doped with element silicon, wherein the content amount of element silicon is less than 10 wt %; and the first silicon-doped diamond-like carbon layer 30 has a light transmission rate that is greater than or substantially equal to 95%.

Specifically, the first silicon-doped diamond-like carbon layer 30 has a thickness of 10 nm-100 nm.

Specifically, the first silicon-doped diamond-like carbon layer 30 is used to fill up surface defects of the first barrier layer 20 to further enhance the capability of the OLED package structure in blocking external moisture and oxygen.

Figure 4:
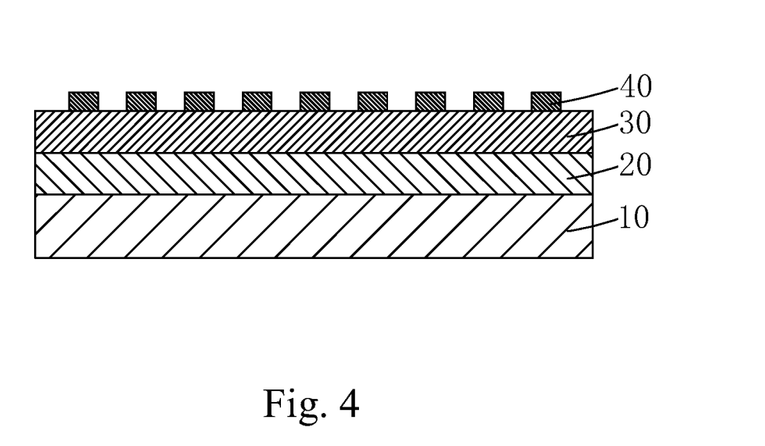
FIG. 4 is a schematic view illustrating Step 3 of the OLED packaging method according to the present invention.

Step 3: as shown in FIG. 4, forming a diamond-like carbon scattering layer 40 on the first silicon-doped diamond-like carbon layer 30.

Specifically, in Step 3, pulsed laser deposition (PLD), sputtering, or plasma enhanced chemical vapor deposition (PECVD) is applied to form the diamond-like carbon scattering layer 40.

Specifically, the diamond-like carbon scattering layer 40 is formed of a material comprising non-doped diamond-like carbon.

Figure 5:
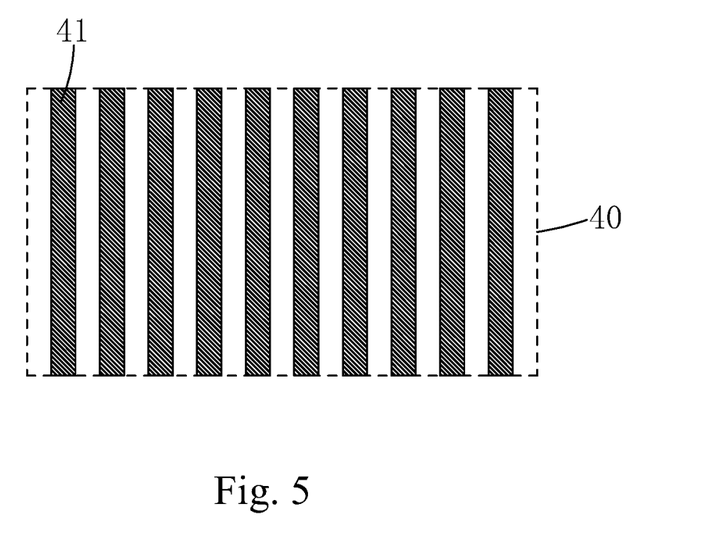
FIG. 5 is a top plan view illustrating a first example of a diamond-like carbon scattering layer formed in Step 3 of the OLED packaging method according to the present invention.
Figure 6:
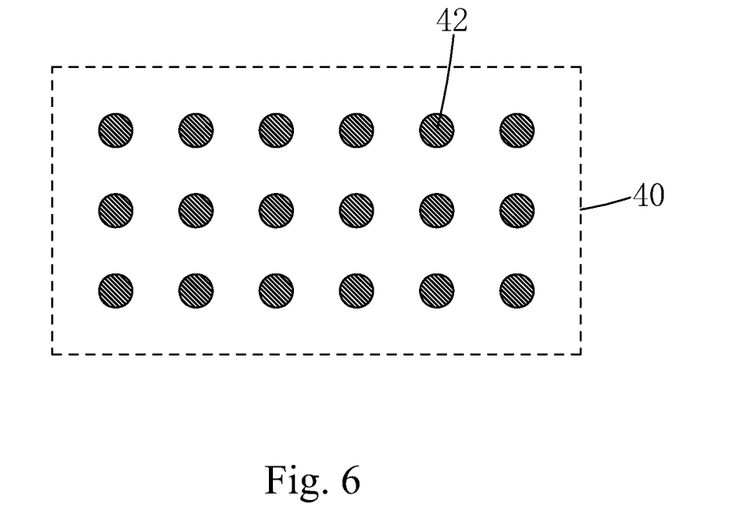
FIG. 6 is a top plan view illustrating a second example of the diamond-like carbon scattering layer formed in Step 3 of the OLED packaging method according to the present invention.

Specifically, as shown in FIGS. 5 and 6, the diamond-like carbon scattering layer 40 comprises a plurality of strip-like diamond-like carbon film layers 41 that are spaced from each other or alternatively comprises a plurality of circular diamond-like carbon film layers 42 arranged in an array.

Specifically, a metal mask plate or an organic photoengraving operation is used to form the plurality of spaced strip-like diamond-like carbon film layers 41 or the plurality of circular diamond-like carbon film layers 42 arranged in an array.

Specifically, the diamond-like carbon scattering layer 40 makes scattering and diffracting to thereby improve light transmission rate.

Specifically, the diamond-like carbon scattering layer 40 has a thickness of 10 nm-1 μm.

Specifically, the diamond-like carbon scattering layer 40 is formed of a material having a refractive index greater than or substantially equal to 2.0.

Figure 7:
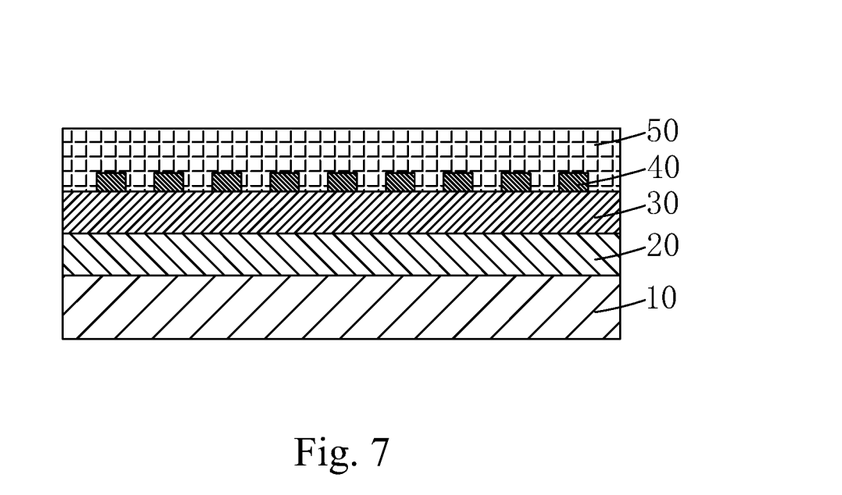
FIG. 7 is a schematic view illustrating Step 4 of the OLED packaging method according to the present invention.

Step 4: as shown in FIG. 7, forming a first organic buffer layer 50 on the first silicon-doped diamond-like carbon layer 30 and the diamond-like carbon scattering layer 40 such that the first organic buffer layer 50 completely covers the first silicon-doped diamond-like carbon layer 30 and the diamond-like carbon scattering layer 40.

Specifically, in Step 4, ink jet printing (UP), plasma enhanced chemical vapor deposition (PECVD), or slot coating is applied to form the first organic buffer layer 50.

Specifically, the first organic buffer layer 50 has a thickness of 1 μm-10 μm.

Specifically, the first organic buffer layer 50 is formed of a material comprising one or multiple ones of acrylic resin, compounds of polystyrenes, and compounds of polyesters.

Specifically, the first organic buffer layer 50 provides a function of releasing stress induced in curving or folding an OLED display device and a function of planarization.

Figure 8:
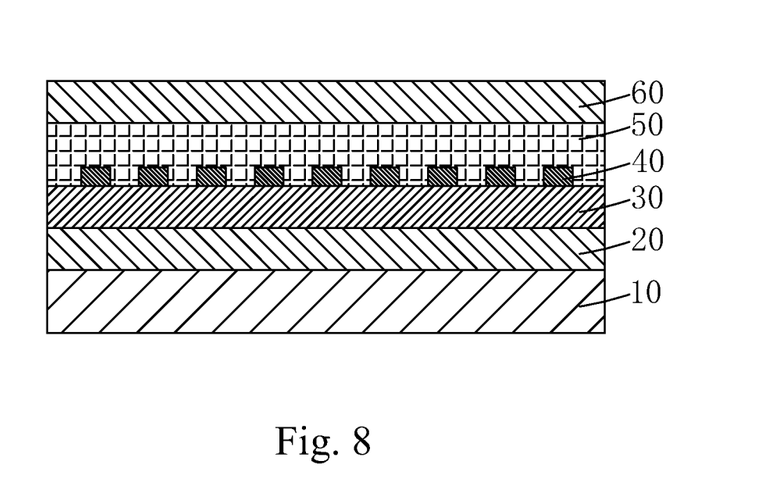
FIG. 8 is a schematic view illustrating Step 5 of the OLED packaging method according to the present invention and is also a schematic cross-sectional view of a first example of an OLED package structure according to the present invention.

Step 5: as shown in FIG. 8, forming a second barrier layer 60 on the first organic buffer layer 50, such that the second barrier layer 60 covers an entire surface of the first organic buffer layer 50.

To this point, basic packaging of the OLED device 10 is completed.

Specifically, in Step 5, the second barrier layer 60 is formed with a process that is similar to that of forming the first barrier layer 20 and the second barrier layer 60 has a material and a thickness that are identical to those of the first barrier layer 20.

Figure 9:
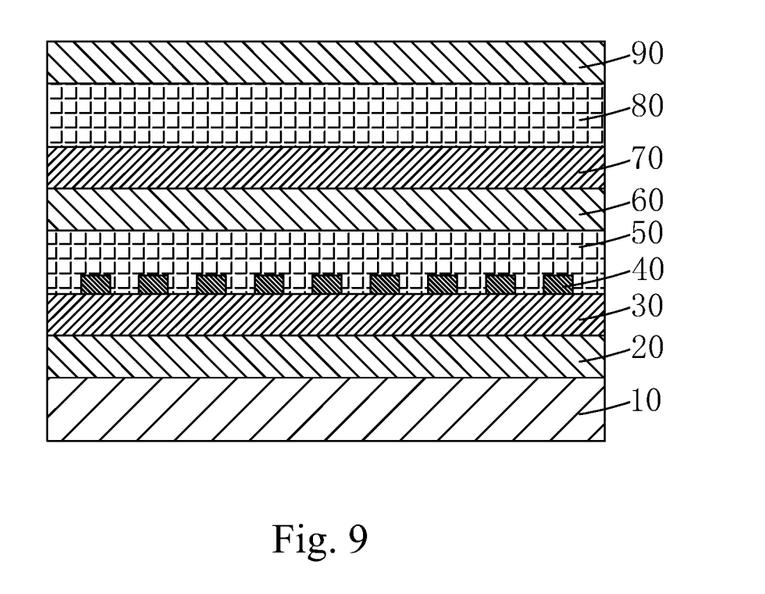
FIG. 9 is a schematic view illustrating Step 6 of the OLED packaging method according to the present invention and is also a schematic cross-sectional view of a second example of an OLED package structure according to the present invention n.

In addition, to further improve the capability of the OLED package structure in blocking moisture and oxygen, the OLED packaging method according to the present invention may further comprises:

Step 6: as shown in FIG. 9, forming a second silicon-doped diamond-like carbon layer 70 on the second barrier layer 60 to cover an entire surface of the second barrier layer 60, forming a second organic buffer layer 80 on the second silicon-doped diamond-like carbon layer 70 to cover an entire surface of the second silicon-doped diamond-like carbon layer 70, and forming a third barrier layer 90 on the second organic buffer layer 80 to cover an entire surface of the second organic buffer layer 80.

Specifically, the second silicon-doped diamond-like carbon layer 70 is manufactured with a process that is similar to that of the first silicon-doped diamond-like carbon layer 30 and the second silicon-doped diamond-like carbon layer 70 has a material and a thickness identical to those of the first silicon-doped diamond-like carbon layer 30.

Specifically, the second organic buffer layer 80 is manufactured with a process that is similar to that of the first organic buffer layer 50 and the second organic buffer layer 80 has a material and a thickness identical to those of the first organic buffer layer 50.

Specifically, the third barrier layer 90 is manufactured with a process that is similar to that of the second barrier layer 60 and the third barrier layer 90 has a material and a thickness identical to those of the second barrier layer 60.

In the above-described OLED packaging method, a silicon-doped diamond-like carbon layer and a diamond-like carbon scattering layer are both provided in an OLED package structure so that the silicon-doped diamond-like carbon layer may provide an effect of blocking external moisture and oxygen and the diamond-like carbon scattering layer is used to provide an effect of increasing light transmission rate, whereby it is possible to greatly extend the service life of the OLED device and also to ensure a relatively high light output efficiency of the OLED device.

Referring to FIG. 8, based on the above-described OLED packaging method, the present invention also provides an OLED package structure, which comprises an OLED device 10, a first barrier layer 20 arranged on the OLED device 10 and covering an entire surface of the OLED device 10, a first silicon-doped diamond-like carbon layer 30 arranged on the first barrier layer 20 and covering an entire surface of the first barrier layer 20, a diamond-like carbon scattering layer 40 arranged on the first silicon-doped diamond-like carbon layer 30, a first organic buffer layer 50 arranged on the first silicon-doped diamond-like carbon layer 30 and the diamond-like carbon scattering layer 40 and completely covering the first silicon-doped diamond-like carbon layer 30 and the diamond-like carbon scattering layer 40, and a second barrier layer 60 arranged on the first organic buffer layer 50 and covering an entire surface of the first organic buffer layer 50.

Specifically, the first barrier layer 20 is formed of a material comprising one or multiple ones of zirconium aluminate ($ZrAl_xO_y$), graphene, aluminum oxide ($Al_2O_3$), zirconium oxide ($ZrO_2$), zinc peroxide ($ZnO_2$), silicon nitride ($SiN_x$), silicon carbonitride (SiCN), silicon oxide ($SiO_x$), and titanium dioxide ($TiO_2$).

Specifically, the first barrier layer 20 has a thickness of 0.5 μm-1 μm.

Specifically, the first silicon-doped diamond-like carbon layer 30 has a thickness of 10 nm-100 nm.

Specifically, the first silicon-doped diamond-like carbon layer 30 comprises diamond-like carbon doped with element silicon, wherein the content amount of element silicon is less than 10 wt %; and the first silicon-doped diamond-like carbon layer 30 has a light transmission rate that is greater than or substantially equal to 95%.

Specifically, the diamond-like carbon scattering layer 40 is formed of a material comprising non-doped diamond-like carbon.

Specifically, as shown in FIGS. 5 and 6, the diamond-like carbon scattering layer 40 comprises a plurality of strip-like diamond-like carbon film layers 41 that are spaced from each other or alternatively comprises a plurality of circular diamond-like carbon film layers 42 arranged in an array. Specifically, the diamond-like carbon scattering layer 40 has a thickness of 10 nm-1 μm.

Specifically, the diamond-like carbon scattering layer 40 is formed of a material having a refractive index greater than or substantially equal to 2.0.

Specifically, the first organic buffer layer 50 is formed of a material comprising one or multiple ones of acrylic resin, compounds of polystyrenes, and compounds of polyesters.

Specifically, the first organic buffer layer 50 has a thickness of 1 μm-10 μm.

Specifically, the second barrier layer 60 has a material and a thickness identical to those of the first barrier layer 20.

Further, referring to FIG. 9, the OLED package structure according to the present invention may further comprises: a second silicon-doped diamond-like carbon layer 70 arranged on the second barrier layer 60 and covering an entire surface of the second barrier layer 60, a second organic buffer layer 80 arranged on the second silicon-doped diamond-like carbon layer 70 and covering an entire surface of the second silicon-doped diamond-like carbon layer 70, and a third barrier layer 90 arranged on the second organic buffer layer 80 and covering an entire surface of the second organic buffer layer 80.

Specifically, the second silicon-doped diamond-like carbon layer 70 has a material and a thickness identical to those of the first silicon-doped diamond-like carbon layer 30.

Specifically, the second organic buffer layer 80 has a material and a thickness identical to those of the first organic buffer layer 50.

Specifically, the third barrier layer 90 has a material and a thickness identical to those of the second barrier layer 60.

In the above-described OLED package structure, a silicon-doped diamond-like carbon layer and a diamond-like carbon scattering layer are both provided, so that the silicon-doped diamond-like carbon layer may provide an effect of blocking external moisture and oxygen and the diamond-like carbon scattering layer is used to provide an effect of increasing light transmission rate, whereby it is possible to greatly extend the service life of the OLED device and also to ensure a relatively high light output efficiency of the OLED device.

In summary, the present invention provides an OLED packaging method and an OLED package structure. The OLED packaging method of the present invention is such that a silicon-doped diamond-like carbon layer and a diamond-like carbon scattering layer are both provided in an OLED package structure so that the silicon-doped diamond-like carbon layer may provide an effect of blocking external moisture and oxygen and the diamond-like carbon scattering layer is used to provide an effect of increasing light transmission rate, whereby it is possible to greatly extend the service life of the OLED device and also to ensure a relatively high light output efficiency of the OLED device. The OLED package structure of the present invention is such that a silicon-doped diamond-like carbon layer and a diamond-like carbon scattering layer are both provided, so that the silicon-doped diamond-like carbon layer may provide an effect of blocking external moisture and oxygen and the diamond-like carbon scattering layer is used to provide an effect of increasing light transmission rate, whereby it is possible to greatly extend the service life of the OLED device and also to ensure a relatively high light output efficiency of the OLED device.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. An organic light-emitting display (OLED) packaging method, comprising the following steps:
    Step 1: providing a OLED device and forming a first barrier layer on the OLED device such that the first barrier layer covers an entire surface of the OLED device;
    Step 2: forming a first silicon-doped diamond-like carbon layer on the first barrier layer such that the first silicon-doped diamond-like carbon layer covers an entire surface of the first barrier layer;
    Step 3: forming a diamond-like carbon scattering layer on the first silicon-doped diamond-like carbon layer;
    Step 4: forming a first organic buffer layer on the first silicon-doped diamond-like carbon layer and the diamond-like carbon scattering layer such that the first organic buffer layer completely covers the first silicon-doped diamond-like carbon layer and the diamond-like carbon scattering layer; and
    Step 5: forming a second barrier layer on the first organic buffer layer, such that the second barrier layer covers an entire surface of the first organic buffer layer.

2. The OLED packaging method as claimed in claim 1, wherein in Step 2, pulsed laser deposition, sputtering, or plasma enhanced chemical vapor deposition is applied to form the first silicon-doped diamond-like carbon layer; and
    the first silicon-doped diamond-like carbon layer is formed of a material comprising diamond-like carbon doped with element silicon, wherein a content amount of element silicon is less than 10 wt %; the first silicon-doped diamond-like carbon layer has a light transmission rate that is greater than or substantially equal to 95%; and the first silicon-doped diamond-like carbon layer has a thickness of 10 nm-100 nm.

3. The OLED packaging method as claimed in claim 1, wherein in Step 3, pulsed laser deposition, sputtering, or plasma enhanced chemical vapor deposition is applied to form the diamond-like carbon scattering layer; and
    the diamond-like carbon scattering layer is formed of a material comprising non-doped diamond-like carbon; the diamond-like carbon scattering layer comprises a plurality of strip-like diamond-like carbon film layers spaced from each other or a plurality of circular diamond-like carbon film layers arranged in an array; and the diamond-like carbon scattering layer has a thickness of 10 nm-1 µm.

4. The OLED packaging method as claimed in claim 1, wherein in Step 1, plasma enhanced chemical vapor deposition, atomic layer deposition, pulsed laser deposition, or sputtering is applied to form the first barrier layer;
    the first barrier layer is formed of a material comprising one or multiple ones of zirconium aluminate, graphene, aluminum oxide, zirconium oxide, zinc peroxide, silicon nitride, silicon carbonitride, silicon oxide, and titanium dioxide; and the first barrier layer has a thickness of 0.5 µm-1 µm; and
    in Step 4, ink jet printing, plasma enhanced chemical vapor deposition, or slot coating is applied to form the first organic buffer layer; the first organic buffer layer is formed of a material comprising one or multiple ones of acrylic resin, compounds of polystyrenes, and compounds of polyesters; and the first organic buffer layer has a thickness of 1 µm-10 µm.

5. The OLED packaging method as claimed in claim 1 further comprising Step 6: forming a second silicon-doped diamond-like carbon layer on the second barrier layer to cover an entire surface of the second barrier layer, forming a second organic buffer layer on the second silicon-doped diamond-like carbon layer to cover an entire surface of the second silicon-doped diamond-like carbon layer, and forming a third barrier layer on the second organic buffer layer to cover an entire surface of the second organic buffer layer.

6. An organic light-emitting display (OLED) package structure, comprising an OLED device, a first barrier layer arranged on the OLED device and covering an entire surface of the OLED device, a first silicon-doped diamond-like carbon layer arranged on the first barrier layer and covering an entire surface of the first barrier layer, a diamond-like carbon scattering layer arranged on the first silicon-doped diamond-like carbon layer, a first organic buffer layer arranged on the first silicon-doped diamond-like carbon layer and the diamond-like carbon scattering layer and completely covering the first silicon-doped diamond-like carbon layer and the diamond-like carbon scattering layer, and a second barrier layer arranged on the first organic buffer layer and covering an entire surface of the first organic buffer layer.

7. The OLED package structure as claimed in claim 6, wherein the first silicon-doped diamond-like carbon layer is formed of a material comprising diamond-like carbon doped with element silicon, wherein a content amount of element silicon is less than 10 wt %; the first silicon-doped diamond-like carbon layer has a light transmission rate that is greater than or substantially equal to 95%; and the first silicon-doped diamond-like carbon layer has a thickness of 10 nm-100 nm.

8. The OLED package structure as claimed in claim 6, wherein the diamond-like carbon scattering layer is formed of a material comprising non-doped diamond-like carbon; the diamond-like carbon scattering layer comprises a plurality of strip-like diamond-like carbon film layers spaced from each other or a plurality of circular diamond-like carbon film layers arranged in an array; and the diamond-like carbon scattering layer has a thickness of 10 nm-1 μm.

9. The OLED package structure as claimed in claim 6, wherein the first barrier layer is formed of a material comprising one or multiple ones of zirconium aluminate, graphene, aluminum oxide, zirconium oxide, zinc peroxide, silicon nitride, silicon carbonitride, silicon oxide, and titanium dioxide; and the first barrier layer has a thickness of 0.5 μm-1 μm; and the first organic buffer layer is formed of a material comprising one or multiple ones of acrylic resin, compounds of polystyrenes, and compounds of polyesters; and the first organic buffer layer has a thickness of 1 μm-10 μm.

10. The OLED package structure as claimed in claim 6 further comprising: a second silicon-doped diamond-like carbon layer arranged on the second barrier layer and covering an entire surface of the second barrier layer, a second organic buffer layer arranged on the second silicon-doped diamond-like carbon layer and covering an entire surface of the second silicon-doped diamond-like carbon layer, and a third barrier layer arranged on the second organic buffer layer and covering an entire surface of the second organic buffer layer.

11. An organic light-emitting display (OLED) package structure, comprising an OLED device, a first barrier layer arranged on the OLED device and covering an entire surface of the OLED device, a first silicon-doped diamond-like carbon layer arranged on the first barrier layer and covering an entire surface of the first barrier layer, a diamond-like carbon scattering layer arranged on the first silicon-doped diamond-like carbon layer, a first organic buffer layer arranged on the first silicon-doped diamond-like carbon layer and the diamond-like carbon scattering layer and completely covering the first silicon-doped diamond-like carbon layer and the diamond-like carbon scattering layer, and a second barrier layer arranged on the first organic buffer layer and covering an entire surface of the first organic buffer layer;

wherein the first silicon-doped diamond-like carbon layer is formed of a material comprising diamond-like carbon doped with element silicon, wherein a content amount of element silicon is less than 10 wt %; the first silicon-doped diamond-like carbon layer has a light transmission rate that is greater than or substantially equal to 95%; and the first silicon-doped diamond-like carbon layer has a thickness of 10 nm-100 nm; and wherein the diamond-like carbon scattering layer is formed of a material comprising non-doped diamond-like carbon; the diamond-like carbon scattering layer comprises a plurality of strip-like diamond-like carbon film layers spaced from each other or a plurality of circular diamond-like carbon film layers arranged in an array; and the diamond-like carbon scattering layer has a thickness of 10 nm-1 μm.

12. The OLED package structure as claimed in claim 11, wherein the first barrier layer is formed of a material comprising one or multiple ones of zirconium aluminate, graphene, aluminum oxide, zirconium oxide, zinc peroxide, silicon nitride, silicon carbonitride, silicon oxide, and titanium dioxide; and the first barrier layer has a thickness of 0.5 μm-1 μm; and the first organic buffer layer is formed of a material comprising one or multiple ones of acrylic resin, compounds of polystyrenes, and compounds of polyesters; and the first organic buffer layer has a thickness of 1 μm-10 μm.

13. The OLED package structure as claimed in claim 11 further comprising: a second silicon-doped diamond-like carbon layer arranged on the second barrier layer and covering an entire surface of the second barrier layer, a second organic buffer layer arranged on the second silicon-doped diamond-like carbon layer and covering an entire surface of the second silicon-doped diamond-like carbon layer, and a third barrier layer arranged on the second organic buffer layer and covering an entire surface of the second organic buffer layer.

* * * * *